(12) United States Patent
Chuang et al.

(10) Patent No.: US 12,557,301 B2
(45) Date of Patent: Feb. 17, 2026

(54) METHOD FOR FABRICATING SEMICONDUCTOR STRUCTURE, SEMICONDUCTOR STRUCTURE, AND SEMICONDUCTOR DEVICE

(71) Applicant: CHANGXIN MEMORY TECHNOLOGIES, INC., Hefei (CN)

(72) Inventors: Ling-Yi Chuang, Hefei (CN); Kaimin Lv, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 461 days.

(21) Appl. No.: 18/155,721

(22) Filed: Jan. 17, 2023

(65) Prior Publication Data
US 2024/0057350 A1 Feb. 15, 2024

Related U.S. Application Data

(63) Continuation of application No. PCT/CN2022/118536, filed on Sep. 13, 2022.

(30) Foreign Application Priority Data

Aug. 10, 2022 (CN) .......................... 202210957848.8

(51) Int. Cl.
H10B 80/00 (2023.01)
H01L 23/00 (2006.01)

(52) U.S. Cl.
CPC ............. *H10B 80/00* (2023.02); *H01L 24/03* (2013.01); *H01L 24/05* (2013.01); *H01L 24/08* (2013.01);
(Continued)

(58) Field of Classification Search
CPC .. H10B 80/00; H10B 53/20; H10B 41/20–27; H10B 43/20–27;
(Continued)

(56) References Cited

U.S. PATENT DOCUMENTS

2002/0084458 A1 7/2002 Halbert et al.
2012/0211878 A1 8/2012 Popovic et al.
(Continued)

FOREIGN PATENT DOCUMENTS

CN 106847712 A 6/2017
CN 108155174 A 6/2018
(Continued)

OTHER PUBLICATIONS

ISA State Intellectual Property Office of the People's Republic of China, International Search Report Issued in Application No. PCT/CN2022/118539, Dec. 21, 2022, WIPO, 9 pages.
(Continued)

*Primary Examiner* — Moin M Rahman
(74) *Attorney, Agent, or Firm* — Kilpatrick Townsend & Stockton LLP

(57) ABSTRACT

Embodiments provide a fabricating method, a semiconductor structure, and a semiconductor device. The method includes: providing a plurality of chips, each of the chips includes an element region and a scribe line region arranged in a first direction; stacking the chips to form a chip module, where a stacking direction of the chips is a second direction perpendicular to the first direction, the element regions of the chips are overlapped with each other, and the scribe line regions of the chips are overlapped with each other; planarizing a side surface of each of the scribe line regions distant from the element region after the chip module is formed, to remove at least part of the scribe line regions and expose the power supply wiring layer; and forming a pad on the side surface planarized, where the pad is connected to the power supply wiring layer.

13 Claims, 9 Drawing Sheets

(52) U.S. Cl.
CPC .............. *H01L 24/80* (2013.01); *H01L 24/16* (2013.01); *H01L 24/32* (2013.01); *H01L 24/48* (2013.01); *H01L 24/73* (2013.01); *H01L 2224/03462* (2013.01); *H01L 2224/05017* (2013.01); *H01L 2224/05018* (2013.01); *H01L 2224/05073* (2013.01); *H01L 2224/05557* (2013.01); *H01L 2224/05558* (2013.01); *H01L 2224/08145* (2013.01); *H01L 2224/16148* (2013.01); *H01L 2224/16225* (2013.01); *H01L 2224/32145* (2013.01); *H01L 2224/48235* (2013.01); *H01L 2224/73265* (2013.01); *H01L 2224/80895* (2013.01); *H01L 2224/80896* (2013.01); *H01L 2924/1431* (2013.01); *H01L 2924/1434* (2013.01)

(58) Field of Classification Search
CPC . H10B 51/20; H10B 63/84–845; H01L 24/03; H01L 24/05; H01L 24/08; H01L 24/80; H01L 24/16; H01L 24/32; H01L 24/48; H01L 24/73; H01L 2224/03462; H01L 2224/05017; H01L 2224/05018; H01L 2224/05073; H01L 2224/05557; H01L 2224/05558; H01L 2224/08145; H01L 2224/16148; H01L 2224/16225; H01L 2224/32145; H01L 2224/48235; H01L 2224/73265; H01L 2224/80895; H01L 2224/80896; H01L 2924/1431; H01L 2924/1434; H01L 21/02532; H01L 21/02603; H01L 21/28568; H01L 21/30604; H01L 25/105; H01L 21/30625; H01L 21/6835; H01L 25/00–50; H01L 2225/00–1094; H01L 25/10–13; H01L 2225/10–1094; H01L 25/043; H01L 25/0657; H01L 25/074; H01L 25/0756; H01L 25/117; H01L 25/112; H01L 2225/06503–06596; H01L 25/0652; H01L 25/071; H01L 25/042; H01L 25/0655; H01L 25/072; H01L 25/0753; H01L 25/115; H10D 62/121; H10D 30/024; H10D 30/62; H10D 30/6735; H10D 30/794; H10D 30/797; H10D 62/115; H10D 62/151; H10D 62/292; H10D 62/822; H10D 64/017; H10D 64/021; H10D 64/257; H10D 64/62; H10D 30/014; H10D 30/0323; H10D 30/43; H10D 30/6744; H10D 30/6757; H10D 64/251; H10D 62/116; H10D 62/364

See application file for complete search history.

(56) References Cited

U.S. PATENT DOCUMENTS

| | | | |
|---|---|---|---|
| 2016/0329304 A1* | 11/2016 | Hatakeyama | ........... H01L 24/49 |
| 2018/0040587 A1 | 2/2018 | Tao et al. | |
| 2018/0114777 A1 | 4/2018 | Chiu et al. | |
| 2018/0277516 A1* | 9/2018 | Kume | ...................... H01L 24/17 |
| 2021/0242037 A1* | 8/2021 | Wu | ...................... H01L 25/0657 |
| 2024/0038726 A1 | 2/2024 | Obata et al. | |

FOREIGN PATENT DOCUMENTS

| | | | |
|---|---|---|---|
| CN | 113056819 | A | 6/2021 |
| CN | 114664671 | A | 6/2022 |
| JP | 2008235577 | A | 10/2008 |
| TW | 200608526 | A | 3/2006 |
| WO | 8904113 | A1 | 5/1989 |

OTHER PUBLICATIONS

Non-final Office Action issued in US corresponding U.S. Appl. No. 18/166,752 mailed on Sep. 22, 2025, 15 pages.

* cited by examiner

METHOD FOR FABRICATING SEMICONDUCTOR STRUCTURE, SEMICONDUCTOR STRUCTURE, AND SEMICONDUCTOR DEVICE

CROSS-REFERENCE TO RELATED APPLICATION

This application is a continuation of PCT/CN2022/118536, filed on Sep. 13, 2022, which claims priority to Chinese Patent Application No. 202210957848.8 titled "METHOD FOR FABRICATING SEMICONDUCTOR STRUCTURE, SEMICONDUCTOR STRUCTURE, AND SEMICONDUCTOR DEVICE" and filed to the State Patent Intellectual Property Office on Aug. 10, 2022, the entire contents of which are incorporated herein by reference.

TECHNICAL FIELD

The present disclosure relates to the field of semiconductors, and more particularly, to a method for fabricating a semiconductor structure, the semiconductor structure, and a semiconductor device.

BACKGROUND

To improve integration of a semiconductor structure, more than one chip may be placed in a same package structure. A high bandwidth memory (HBM) is a new type of memory. In a chip stacking technology represented by the HBM, an original one-dimensional memory layout is extended to a three-dimensional one. That is, a plurality of chips are stacked together and packaged, thereby greatly improving density of chips, and achieving a large capacity and high bandwidth.

However, performance of the HBM needs to be improved.

SUMMARY

Embodiments of the present disclosure provide a semiconductor structure, a method for fabricating the semiconductor structure, and a semiconductor device.

According to some embodiments of the present disclosure, an aspect of the embodiments of the present disclosure provides a method for fabricating a semiconductor structure. The method for fabricating the semiconductor structure includes: providing a plurality of chips, where each of the plurality of chips includes an element region and a scribe line region arranged in a first direction, at least one of the plurality of chips has a power supply wiring layer, and the power supply wiring layer extends from the element region to the scribe line region; stacking the plurality of chips to form a chip module, where a stacking direction of the plurality of chips is a second direction, the second direction is perpendicular to the first direction, the element regions of the plurality of chips are overlapped with each other, and the scribe line regions of the plurality of chips are overlapped with each other; planarizing a side surface of each of the scribe line regions distant from the element region after the chip module is formed, to remove at least part of the scribe line regions and expose the power supply wiring layer; and forming a pad on the side surface planarized, where the pad is connected to the power supply wiring layer.

According to some embodiments of the present disclosure, another aspect of the embodiments of the present disclosure also provides a semiconductor structure. The semiconductor structure includes a chip module comprising a plurality of chips stacked, where each of the plurality of chips includes an element region arranged along a first direction, a stacking direction of the plurality of chips is a second direction, and the second direction is perpendicular to the first direction. At least one of the plurality of chips further has a power supply wiring layer, and the power supply wiring layer extends to an edge of the at least one chip along the element region. A pad is further arranged on a side surface of the at least one chip, and the pad is connected to the power supply wiring layer.

According to some embodiments of the present disclosure, yet another aspect of the embodiments of the present disclosure also provides a semiconductor device. The semiconductor device includes: a substrate, and a chip module arranged on the substrate and comprising a plurality of chips stacked, where each of the plurality of chips includes an element region arranged along a first direction, a stacking direction of the plurality of chips is a second direction, and the second direction is perpendicular to the first direction. At least one of the plurality of chips further has a power supply wiring layer, and the power supply wiring layer extends to an edge of the at least one chip along the element region. A pad is further arranged on a side surface of the at least one chip, and the pad is connected to the power supply wiring layer.

BRIEF DESCRIPTION OF THE DRAWINGS

The accompanying drawings herein are incorporated in and constitute a part of this specification, illustrate embodiments conforming to the present disclosure and, together with the specification, serve to explain the principles of the present disclosure. Apparently, the accompanying drawings in the following description show merely some embodiments of the present disclosure, and persons of ordinary skill in the art may still derive other drawings from these accompanying drawings without creative efforts.

DETAILED DESCRIPTION

Figure 1:
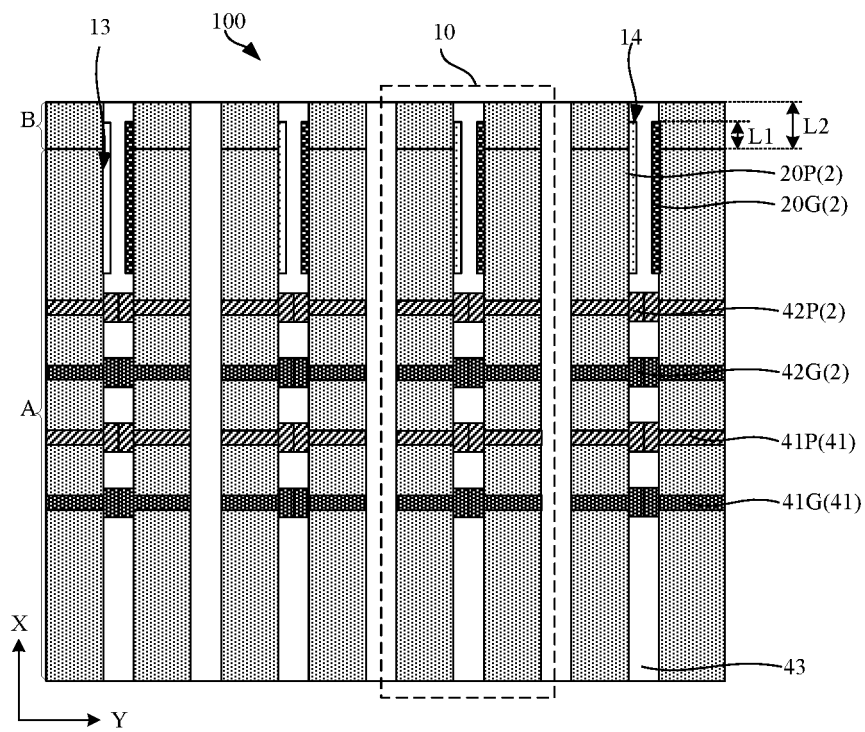
FIGS. 1 to 17 respectively illustrate schematic structural diagrams corresponding to steps of a method for fabricating a semiconductor structure according to an embodiment of the present disclosure.

Due to process errors, a total thickness variation (TTV) of a side surface of a chip module formed by stacking a plurality of chips is larger. That is, the side surfaces of the plurality of chips are uneven, which may adversely affect the process of fabricating pads on the side surfaces of chips, thereby reducing welding strength between the pads and peripheral devices, and thus having a negative effect on performance of a semiconductor structure.

Embodiments of the present disclosure provide a method for fabricating a semiconductor structure, including: providing a plurality of chips, where each of the chips includes an element region and a scribe line region; and planarizing a side surface of each of the scribe line regions distant from the element region after a chip module is formed, to remove at least part of the scribe line regions. That is, the scribe line regions are retained before the chip module is formed; and the scribe line regions are planarized after the chip module is formed, thereby improving the flatness of the side surface of the chip module. Compared with the power supply wiring layer positioned only in the element region, the power supply wiring layer extends to the scribe line region, which makes it more easier to expose the power supply wiring layer by means of planarization, and avoids causing damage to the element region by excessive planarization.

The embodiments of the present disclosure will be described in detail below in conjunction with the accompanying drawings. However, a person of ordinary skill in the art may understand that in the embodiments of the present disclosure, many technical details are put forward such that a reader may better understand the embodiments of the present disclosure. However, the technical solutions requested to be protected by the embodiments of the present disclosure may also be implemented even without these technical details or various variations and modifications based on the following embodiments.

As shown in FIGS. 1 to 17, an embodiment of the present disclosure provides a method for fabricating a semiconductor structure. The method for fabricating the semiconductor structure will be described in detail below with reference to the accompanying drawings.

In some embodiments, referring to FIG. 1 to FIG. 10, in Step I, a plurality of chips 1 are provided, where each of the chips 1 includes an element region A and a scribe line region B arranged in a first direction X. For example, a transistor, a capacitor, a word line, a bit line, and other elements are provided in the element region A. In addition, a plurality of power supply signal lines 12 (referring to FIG. 3 to FIG. 5) are further provided in the element region A. The power supply signal lines 12 may provide various voltage signals, such as digital signals or analog signals, to the elements. The power supply signal lines 12 may be ground signal lines 12G or power source signal lines 12P. Different ground signal lines 12G have different voltage signals, and different power source signal lines 12P have different voltage signals.

It should be noted that the plurality of chips 1 are formed by cutting a wafer. That is, laser light is generally employed to irradiate a centerline position of the scribe line region B to form a modified layer. Because the wafer is subsequently divided into the plurality of chips 1 along the modified layer, generally no elements are provided in the scribe line region B.

With continued reference to FIGS. 1-10, at least one of the plurality of chips 1 has a power supply wiring layer 2 extending from the element region A to the scribe line region B. The power supply wiring layer 2 is electrically connected to the power supply signal line 12 in the element region A to supply a voltage signal to the elements in the element region A through the power supply wiring layer 2.

In some embodiments, the scribe line region B has a dielectric layer 43 covering the power supply wiring layer 2. The power supply wiring layer 2 has an end surface 14 far away from the element region A. That is, the dielectric layer 43 also covers the end surface 14 of the power supply wiring layer 2. In addition, the dielectric layer 43 may also cover a front surface or back surface of the chip 1.

Extension of the power supply wiring layer 2 into the scribe line region B can set a certain process margin for subsequent planarization, to avoid causing damage to the elements in the element region A by excessive planarization. That is, if the power supply wiring layer 2 is positioned only in the element region A, or the end surface of the power supply wiring layer 2 is flush with that of the element region A, it is necessary to prolong planarization time to expose the power supply wiring layer 2, such that part of the element region A may be worn off, and yield and performance of the semiconductor structure may be adversely affected.

In the first direction X, a ratio of a width L2 of the scribe line region B to a length L1 of the power supply wiring layer 2 positioned in the scribe line region B ranges from 10:3 to 2:1. It should be noted that, if the length of the power supply wiring layers 2 extending into the scribe line region B is too short, the power supply wiring layers 2 may not be exposed when the degree of planarization is insufficient. If the length of the power supply wiring layers 2 extending into the scribe line region B is too long, the laser cutting process may be adversely affected. That is, the power supply wiring layers 2 reflect the laser light to the element region A, which may damage the devices in the element region A. When the ratio of the width of the scribe line region B to the length of the power supply wiring layer 2 in the scribe line region B is within the above range, it is advantageous to giving consideration to the above two problems.

For example, the length L1 of the power supply wiring layer 2 of the scribe line region B in the first direction X ranges from 30 um to 50 um, such as 40 um; and the width L2 of the scribe line region B in the first direction X ranges from 90 um to 110 um, for example 100 um. In this way, it is advantageous to sufficiently exposing the end surfaces of the power supply wiring layers 2 by means of the planarization, and reducing the influence on laser cutting.

In some embodiments, referring to FIG. 1 and FIG. 7 to FIG. 9, each of the chips 1 includes one scribe line region B. Thus, a pad 5 may subsequently be formed on a side of the chip module 100 (referring to FIG. 11). In some other embodiments, referring to FIG. 2, each of the chips 1 includes two scribe line regions B, and the two scribe line regions B are positioned on two opposite sides of the element region A. The power supply wiring layers 2 extend from the chip 1 region to the two scribe line regions B. Thus, the pads 5 may subsequently be formed on two opposite sides of the chip module 100.

FIGS. 3 to 6 are schematic diagrams of different active planes 13 of the chip 1. Referring to FIG. 3 to FIG. 6, the power supply wiring layer 2 may extend along the active plane 13 of the chip 1, and accordingly, the power supply signal line 12 may be led out from inside the chip 1 to the active plane 13 of the chip 1, and are electrically connected to the power supply wiring layer 2 on the active plane 13.

Because the active planes 13 may also be understood as the front surfaces of the chips 1, the power supply wiring layers 2 may be fabricated by means of a conventional back-stage process after the elements in the chips 1 are fabricated, and the process is simpler. In addition, the power supply wiring layers 2 may extend only at an edge position close to the upper sides or the lower sides of the chips 1, without covering the entire active planes 13 of the chips 1. Therefore, the contact area between the power supply wiring layers 2 and the chips 1 is small, and the heat of the power supply wiring layers 2 has little influence on the chips 1.

The power supply wiring layers 2 are power source wiring layers 2P, ground wiring layers 2G, or hybrid wiring layers 2PG. That is, one of the power supply wiring layers 2 includes a plurality of power supply wirings 20 isolated from one another. The power supply wiring layer 2 may be divided into the above three types according to the type of power supply wirings 20 in each power supply wiring layer 2.

Figure 3:
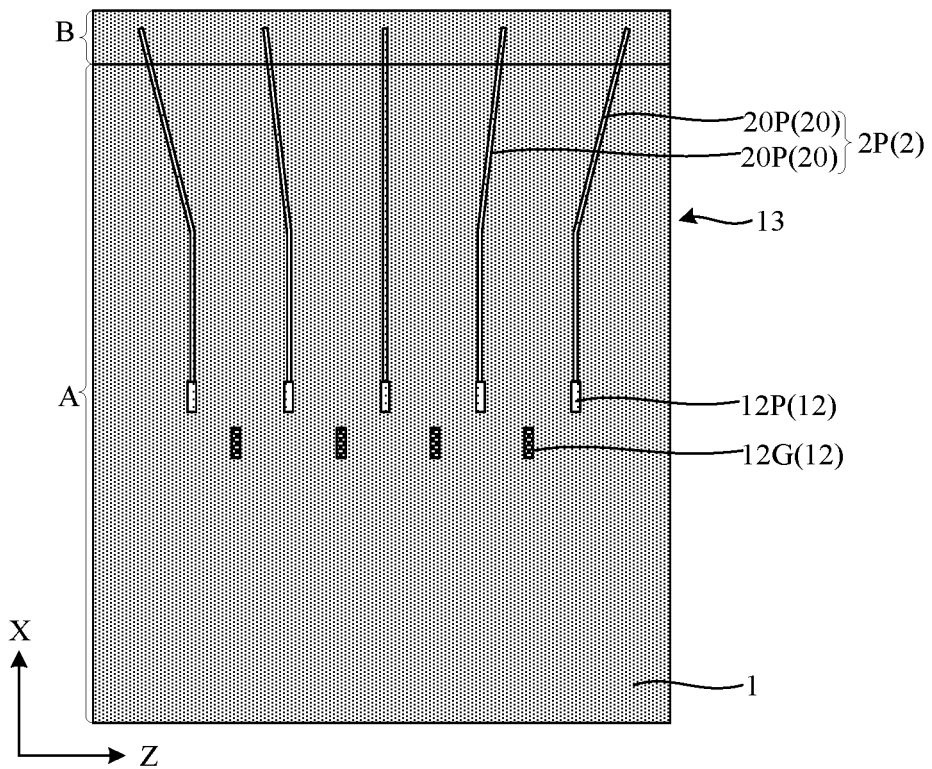
Figure 4:
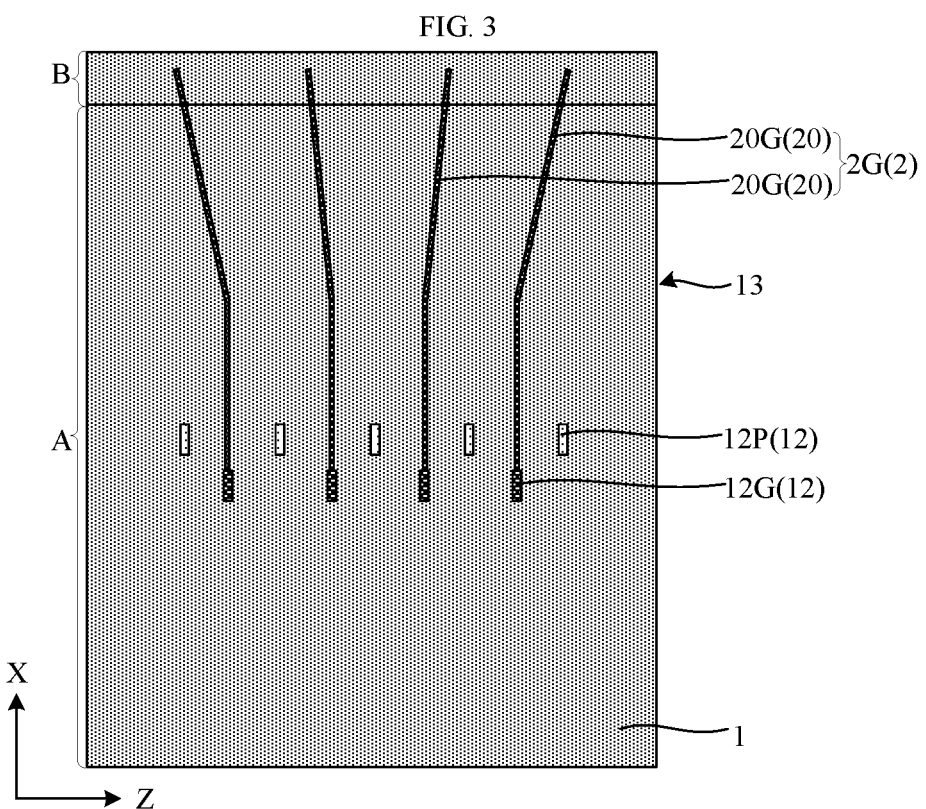

Referring to FIG. 3, each of the power source wiring layers 2P includes a plurality of power source wirings 20P. The plurality of power source wirings 20P are arranged at intervals, and have different voltage signals. Referring to FIG. 4, each of the ground wiring layers 2G includes a plurality of ground wirings 20G. The plurality of ground wirings 20G have different voltage signals. The ground wirings 20G are electrically connected to the ground signal lines 12G correspondingly, and the power source wirings 20P are electrically connected to the power source signal lines 12P correspondingly.

Figure 5:
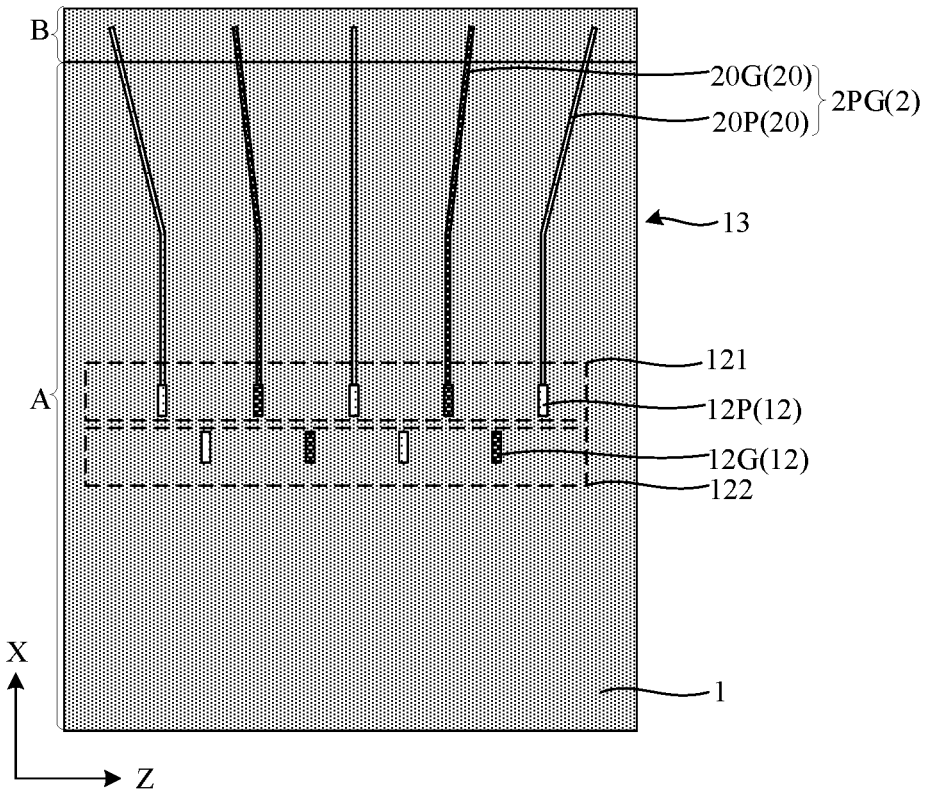
Figure 6:
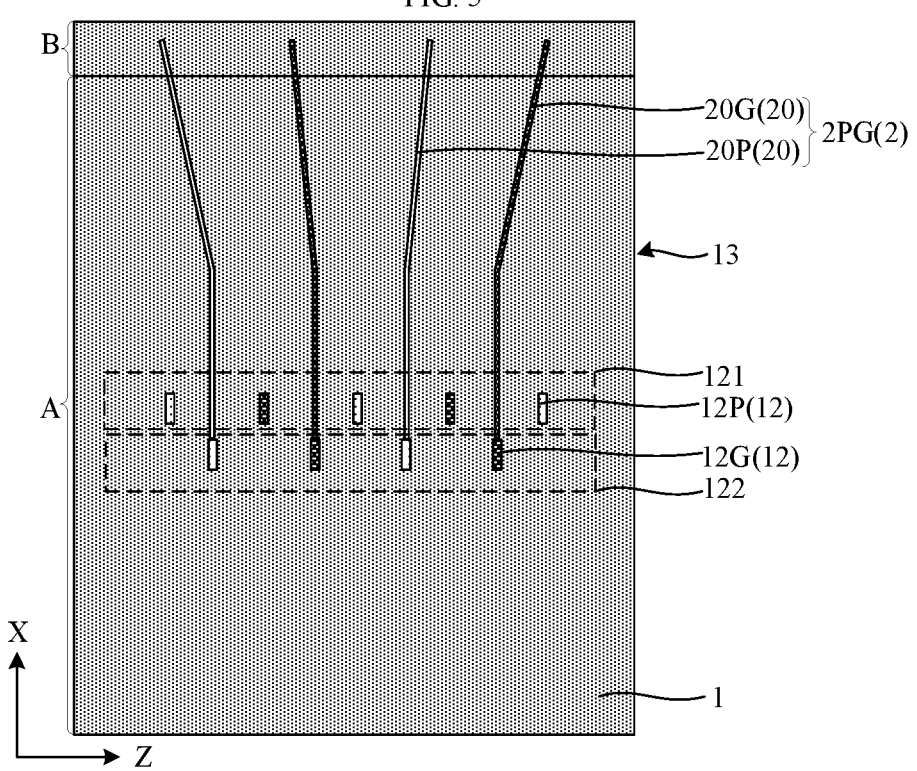

Referring to FIG. 5 and FIG. 6, each of the hybrid wiring layers 2PG includes a plurality of power source wirings 20P and a plurality of ground wirings 20G. The power source wirings 20P and the ground wirings 20G are arranged at intervals. Moreover, different power source wirings 20P have different voltage signals, and different ground wirings 20G have different voltage signals.

In one embodiment, the ground wirings 20G and the power source wirings 20P in the same hybrid wiring layer 2PG are arranged alternately in a third direction Z. The third direction Z is perpendicular to the first direction X and the second direction Y. The ground wirings 20 and the power source wirings 20P are arranged alternately, which is advantageous to reducing electromagnetic interference between the adjacent power supply wirings 20.

If one chip 1 has its own power supply wiring layer 2, at least part of the power supply signal lines 12 of this chip 1 may be directly connected to its own power supply wiring layer 2, i.e., led out by means of its own power supply wiring layer 2. If one chip 1 does not have its own power supply wiring layer 2, the power supply signal lines 12 of this chip 1 may be led out by means of the power supply wiring layers 2 of other chips 1. That is, this chip 1 may be electrically connected to the other chips 1 by means of conductive through-vias 41 and bonding portions 42, thereby electrically connecting its own power supply signal line 12 to the power supply signal lines 12 of the other chips 1, and further electrically connecting to the power supply wiring layers 2 of the other chips 1.

In some embodiments, the plurality of chips 1 have the power supply wiring layers 2. The position and number relationship between the chips 1 and the power supply wiring layers 2 is described in detail below.

In Example I, referring to FIG. 1 to FIG. 8, each of the chips 1 has one power supply wiring layer 2. That is, number of the chips 1 is equal to that of the power supply wiring layers 2. More power supply wiring layers 2 are advantageous to improving the stability of power supply, and then improving the performance of semiconductor structure. In addition, the plurality of power supply wiring layers 2 are uniformly arranged in the plurality of chips 1, such that it is advantageous to unifying the processes for fabricating different chips 1, thereby reducing the production cost.

Figure 2:
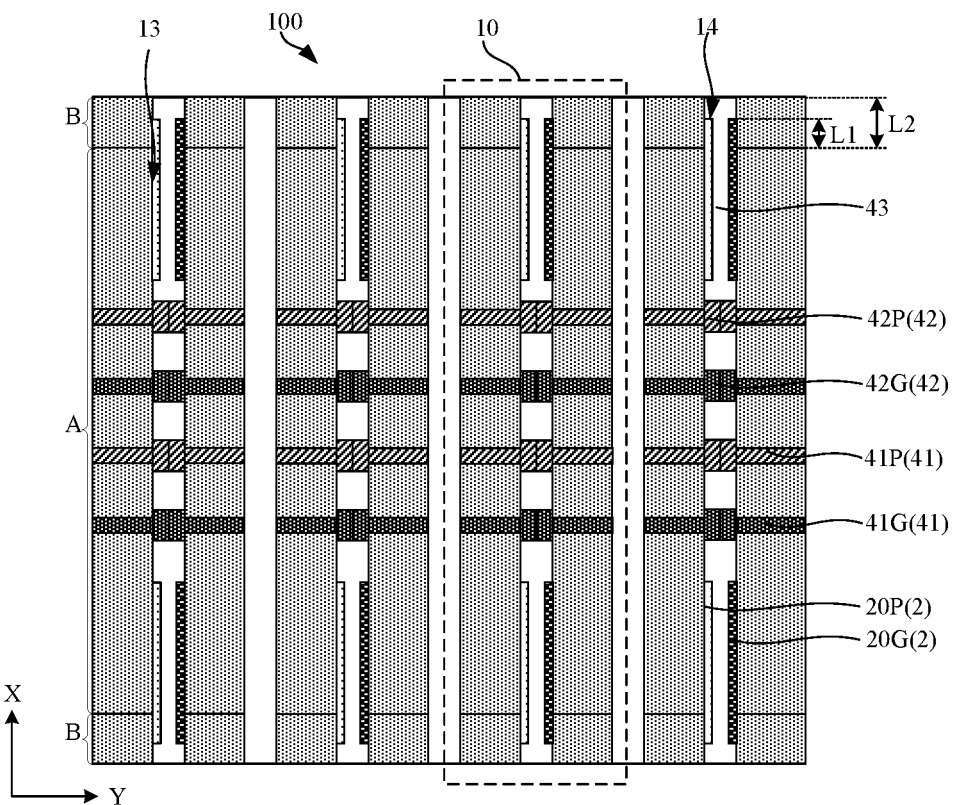

In some embodiments, referring to FIG. 1 and FIG. 2, two adjacent chips 1 constitute a chipset 10, two power supply wiring layers 2 are provided between the two chips 1 in the same chipset 10, and the two power supply wiring layers 2 are respectively positioned on the surfaces of the two chips 1. For example, the two chips 1 in the chipset 10 are bonded face to face. That is, the active plane 13 faces the active plane 13.

In some embodiments, the chips 1 have conductive through-vias 41. For example, the conductive through-vias 41 are through-silicon vias (TSVs). A bonding portion 42 is provided between the two chips 1 in the same chipset 10, and the bonding portion 42 is connected to the conductive through-vias 41 of the two chips 1, such that the chips 1 are electrically connected to each other. For example, each of the chips 1 has a plurality of conductive through-vias 41 arranged at intervals, and the plurality of conductive through-vias 41 are connected in one-to-one correspondence to the plurality of power supply signal lines 12 (referring to FIG. 3 to FIG. 6) in the chip 1. The voltage signals on the plurality of power supply signal lines 12 in the same chip 1 are different, and accordingly, the voltage signals on the plurality of conductive through-vias 41 in the same chip 1 are also different. In the two chips 1 in the same chipset 10, the conductive through-vias 41 having the same voltage signal are electrically connected by means of the bonding portion 42, such that the power supply signal lines 12 having the same voltage signal in the two chips 1 are electrically connected together.

For example, each of the conductive through-vias 41 includes a plurality of ground through-vias 41G and a plurality of power source through-vias 41P, and the bonding portion 42 includes a plurality of ground bonding portions 42G and a plurality of power source bonding portions 42P. The ground through-vias 41G are connected to the ground bonding portions 42G, and the power source through-vias 41P are connected to the power source bonding portions 42P.

In some embodiments, referring to FIG. 1 to FIG. 4, FIG. 3 and FIG. 4 respectively show the active planes 13 of the two chips 1 in the same chipset 10. One of two power supply wiring layers 2 in the same chipset 10 is a power source wiring layer 2P, and the other one is a ground wiring layer 2G. That is, the power source signal lines 12P in the two chips 1 are both led out by means of the power source wiring layer 2P, and the ground signal lines 12G in the two chips 1 are both led out by means of the ground wiring 20G.

In some other embodiments, referring to FIG. 1, FIG. 2, FIG. 5, and FIG. 6, FIG. 5 and FIG. 6 respectively show the active planes 13 of the two chips 1 in the same chipset 10, and the two power supply wiring layers 2 in the same chipset 10 are both the hybrid wiring layers 2PG. That is, the two chips 1 each include a first power supply signal line set 121 and a second power supply signal line set 122. The power supply signal lines 12 in the first power supply signal line set 121 and the second power supply signal line set 122 each include a power source signal line 12P and a ground signal line 12G. The first power supply signal line sets 121 of the two chips 1 are led out by means of one hybrid wiring layer 2PG, and the second power supply signal line sets 122 of the two chips 1 are led out by means of the other hybrid wiring layer 2PG.

Figure 7:
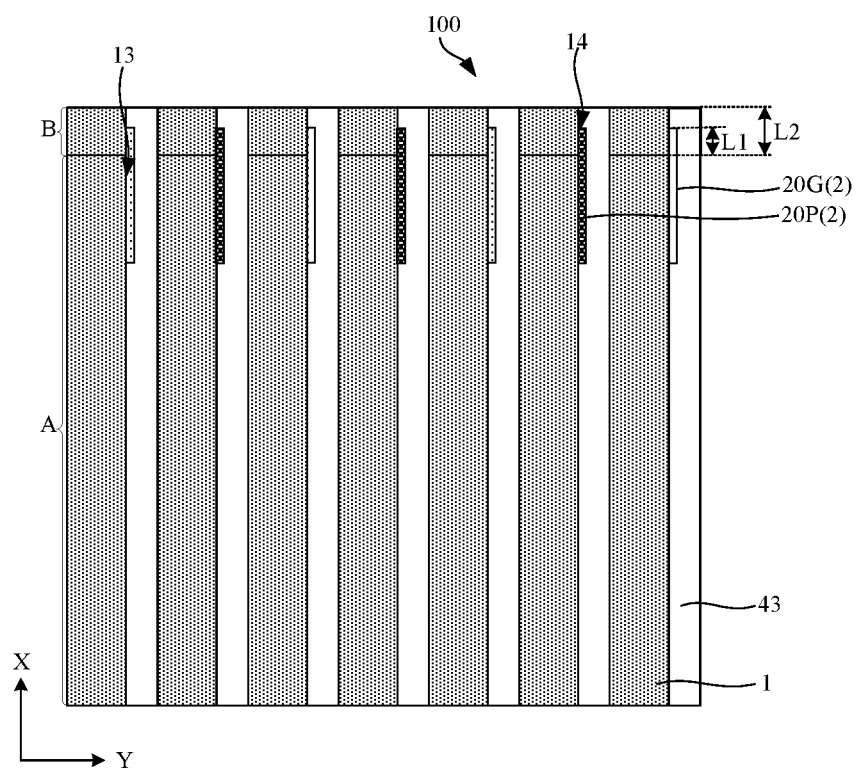

In some other embodiments, referring to FIG. 7, the power supply signal lines 12 in the same chip 1 (referring to FIG. 3 to FIG. 6) are connected to the power supply wiring layers 2, the power supply wiring layers 2 of different chips 1 are independent of each other, and the power supply signal lines 12 of different chips 1 are independent of each other. That is, the power supply signal lines 12 of the plurality of chips 1 need not to be electrically connected together by means of the conductive through-vias 41 and the bonding portions 42, and the power supply signal lines 12 in each of the chips 1 may be led out by means of the power supply wiring layers 2 of the chip 1, without being led out by means of the power supply wiring layers 2 of the other chips 1.

Because the power supply signal lines 12 of each chip 1 may be separately led out, it is advantageous to improving stability of power supply. In addition, the fabrication steps of the bonding portions 42 and the conductive through-vias 41 may also be omitted, thereby reducing the production cost. In addition, the plurality of power supply wiring layers 212 may also be positioned on the same side of the chips 1, such that the distance between the adjacent power supply wiring layers 2 is the same. That is, the power supply wiring layers 2 are arranged more evenly, and the flatness of the side surface of the chip module 100 is higher after the planarization.

Figure 8:
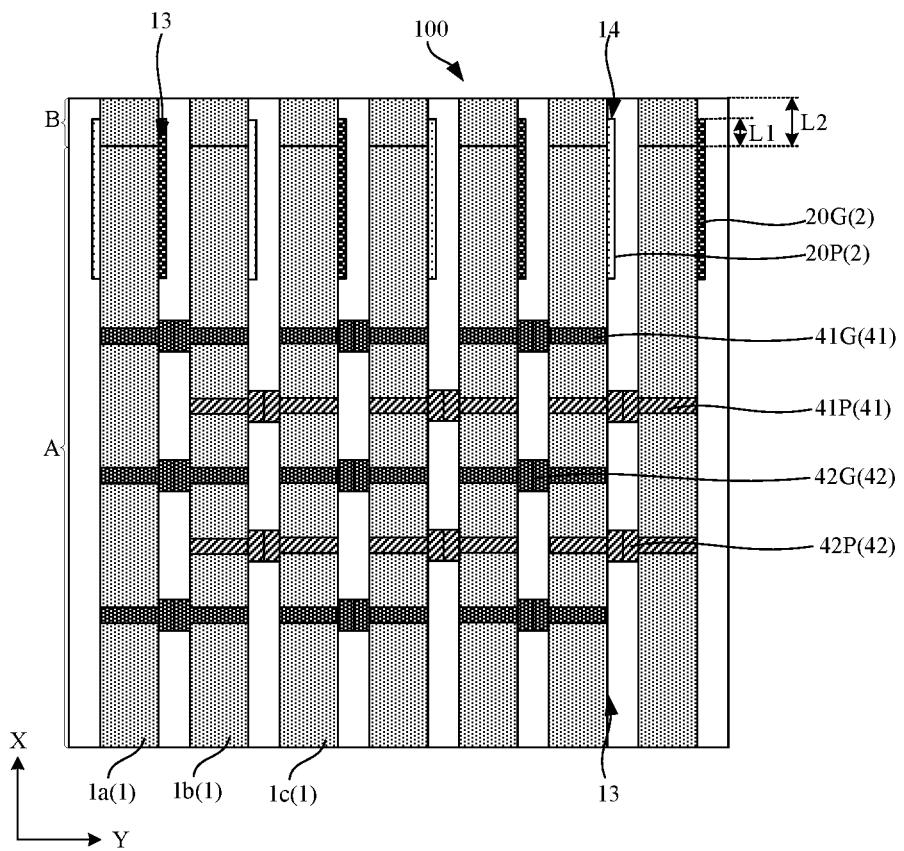

In Example II, the number of the power supply wiring layers 2 may be greater than that of the chips 1. Referring to FIG. 8, the chips 1 on two outermost sides of the chip module 100 each have a power supply wiring layer 2. One power supply wiring layer 2 is provided between two adjacent chips 1, and the power supply wiring layer 2 is electrically connected to the power supply signal lines 12 of the chips 1 on two sides of the power supply wiring layer 2. That is, each of the chips 1 has the power supply wiring layers 2 on two opposite sides, part of the power supply signal lines 12 in the chip 1 are led out from the power supply wiring layer 2 on one side, and the other part of the power supply signal lines 12 in the chip 1 are led out from the power supply wiring layer 2 on the other side. That is, all the power supply wiring layers 2 except the power supply wiring layers 2 on two outermost sides are shared by the two chips 1.

Because a distance between the adjacent power supply wiring layers 2 is approximately equal, arrangement of the power supply wiring layers 2 is more uniform, and the flatness of the side surface of the chip module 100 is higher after the planarization.

A sharing mode is exemplified below. Each of the power supply wiring layers 2 includes a power source wiring layer 2P and a ground wiring layer 2G. The power source wiring layer 2P and the ground wiring layer 2G are alternately arranged in the first direction X. The power source wiring layer 2P positioned on a head side of the chip module 100 may be directly connected to the power supply signal line 12P of a first chip 1a, such that the first chip 1a may not have the power source through-via 41P or the power source bonding portion 42P. The first chip 1a and a second chip 1b share the ground wiring layer 2G. That is, the ground signal lines 12G of the first chip 1a and the second chip 1b are connected together by means of the ground through-vias 41G and the ground bonding portions 42G, and are led out by means of the ground wiring layer 2G between the first chip 1a and the second chip 1b. The second chip 1b and a third chip 1c share the power source wiring layer 2P. That is, the power supply signal lines 12P in the second chip 1b and the third chip 1c are connected together through the power source through-vias 41P and the power source bonding portions 42P, and are led out by means of the power source wiring layer 2P between the second chip 1b and the third chip 1c. Because the second chip 1b and the third chip 1c do not share the ground wiring layer 2G, the ground through-vias 41G and the ground bonding portions 42G of the second chip 1b and the third chip 1c are not electrically connected to each other.

In Example III, the number of the power supply wiring layers 2 may also be smaller than that of the chips 1. For example, referring to FIG. 9, at least two adjacent chips 1 are bonded to form a chipset 10. One power supply wiring layer 2 is provided between two adjacent chipsets 10, and the power supply wiring layer 2 is electrically connected to the chips 1 of the chipsets 10 on two sides thereof. Two sides of the chip module 100 each have one power supply wiring layer 2 electrically connected to the chipsets 10 on the two sides, respectively. That is, except that the two power supply wiring layers 2 on the two sides are not shared by a chipset 101, the other power supply wiring layers 2 at a middle position are shared by the chipsets 10 on the two sides thereof. The chipsets 10 on the two sides of the chip module 100 may be understood as the chipsets 10 on two outermost sides of the chip module 100.

The sharing mode of the power supply wiring layers 2 is exemplified below. The first chipset 101 and the second chipset 102 share the ground wiring layer 2G. That is, the ground signal lines 12G of the first chipset 101 and the second chipset 102 are connected together by means of the ground through-vias 41G and the ground bonding portions 42G, and are led out by means of the ground wiring layer 2G between the first chipset 101 and the second chipset 102. Because the first chipset 101 and the second chipset 102 do not share the power supply wiring layer 2P, the power source through-vias 41P and the power source bonding portions 42P of the first chipset 101 and the second chipset 102 are not electrically connected to each other. The second chipset 102 and the third chipset 103 are connected together by means of a power source wiring layer 2P. That is, the power source signal lines 12P of the second chipset 102 and the third chipset 103 are connected together by means of the power source through-vias 41P and the power source bonding portions 42P, and are led out by means of the power source wiring layer 2P between the second chipset 102 and the third chipset 103.

It should be noted that, in addition to the above several examples, the position and number of the power supply wiring layers 2 may also be adjusted according to the packaging condition of the chip module 100.

Referring to FIG. 1, FIG. 2, and FIG. 7 to FIG. 9, in Step II, the plurality of chips 1 are stacked to form the chip module 100, where the stacking direction of the chips 1 is a second direction Y, the second direction Y is perpendicular to the first direction X, and the stacking direction may also be understood as an arrangement direction of the plurality of chips 1. Next, the element regions A of the plurality of chips 1 are overlapped, and the scribe line regions B of the plurality of chips 1 are overlapped.

In some embodiments, the chips 1 are first placed in the horizontal direction. That is, the plurality of chips 1 are arranged in a direction perpendicular to the horizontal direction. After the plurality of chips 1 are stacked and formed into the chip module 100, the chip module 100 is rotated by 90 degrees, such that the plurality of chips 1 are arranged in the horizontal direction. Thereafter, the chip module 100 is further planarized.

The plurality of chips 1 may be connected by means of hybrid bonding. In some embodiments, the dielectric layers 43 of the adjacent chips 1 may be connected together by means of an acting force such as a molecular force. In addition, the bonding portions 42 of the adjacent chips 1 are bonded together under a heating condition. That is, the dielectric layers 43 are made of an insulating material, and can play an isolation role. The bonding portions 42 are made of a conductive material, and can play an electrical connection role.

Figure 10:
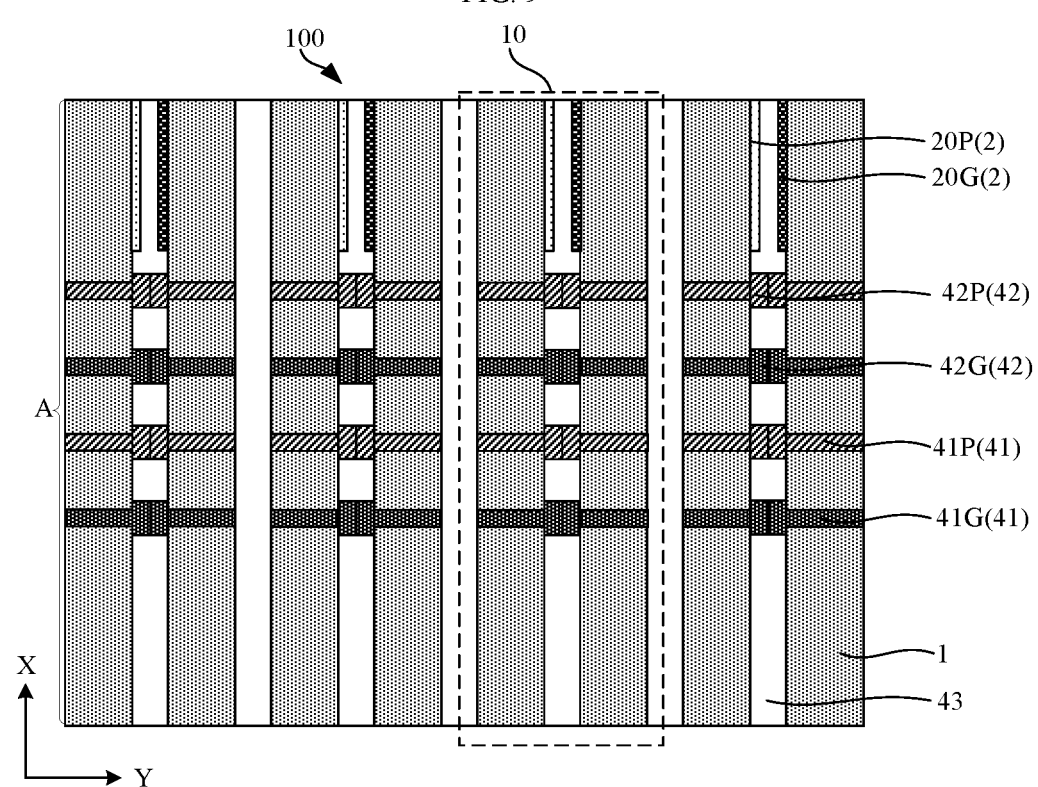

Referring to FIG. 10, in Step III, a side surface of each of the scribe line regions B distant from the element region A is planarized after the chip module 100 is formed, to remove at least part of the scribe line regions B and expose the power supply wiring layer 2. That is, in some embodiments, the planarization may be employed to remove all the scribe line regions B and expose the power supply wiring layers 2 positioned in the element regions A, which is advantageous to reducing the volume of the chip module 100. In some other embodiments, the planarization may also be employed to remove part of the scribe line regions B and expose the power supply wiring layers 2 positioned in the scribe line regions B, thereby facilitating the shortening of the process time.

As can be known from the foregoing description, because the power supply wiring layers 2 extend from the element regions A to the power supply wiring layers 2, the planarization not only can improve the flatness of the side surface of the chip module 100, but also can ensure to avoid causing damage to the element regions A while the power supply wiring layers 2 are exposed, thereby ensuring the performance of the semiconductor structure. After the planarization, the TTV of the side surface of the chip module 100 may be less than 1 um.

In some embodiments, the planarization includes at least one of a back grinding process and a chemical mechanical grinding process. For example, the back grinding process may be performed first. The back grinding process includes two steps of coarse grinding and fine grinding. That is, rapid and precise grinding is performed first with a grinding wheel, and surface micro-etching is then followed with an etching solution, thereby removing a damaged layer caused by grinding, and releasing the stress. Next, the chemical mechanical grinding process is performed, which may ensure a material removal efficiency and obtain a surface with higher flatness.

For example, the planarization is also employed to remove the dielectric layers 43 positioned on the end surfaces of the power supply wiring layers 2 distant from the element regions A, to expose the power supply wiring layers 2.

Figure 11:
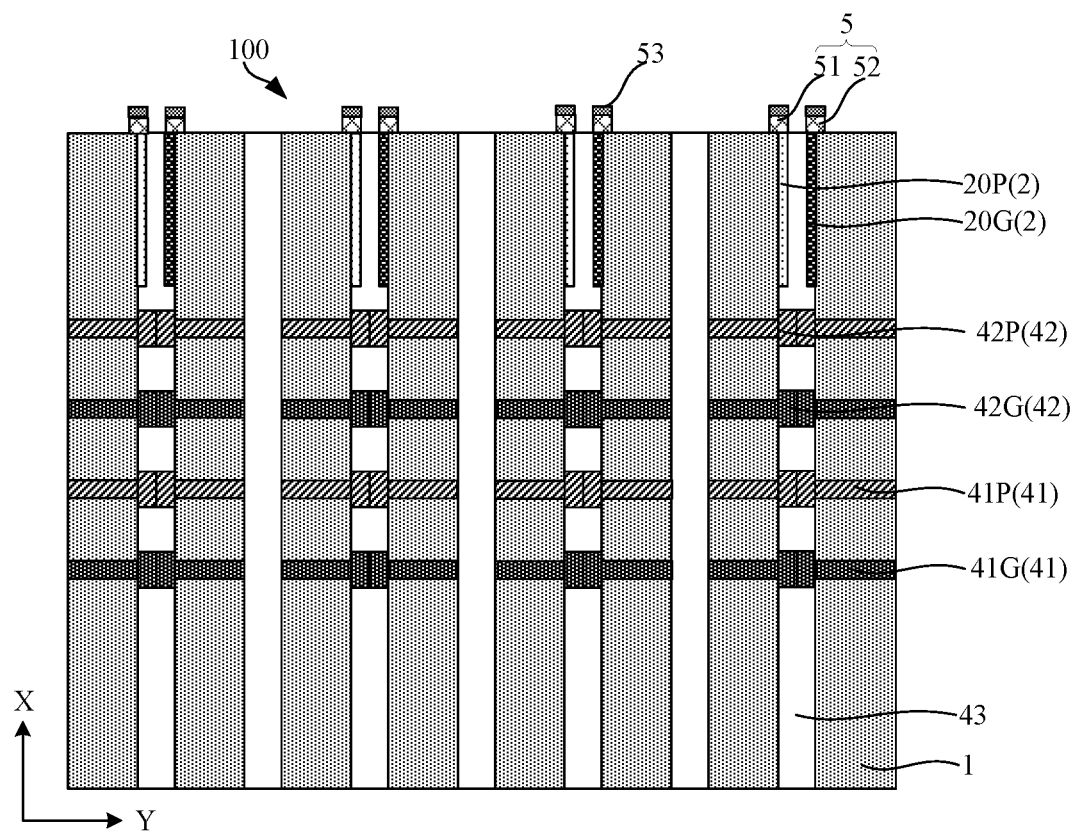
Figure 12:
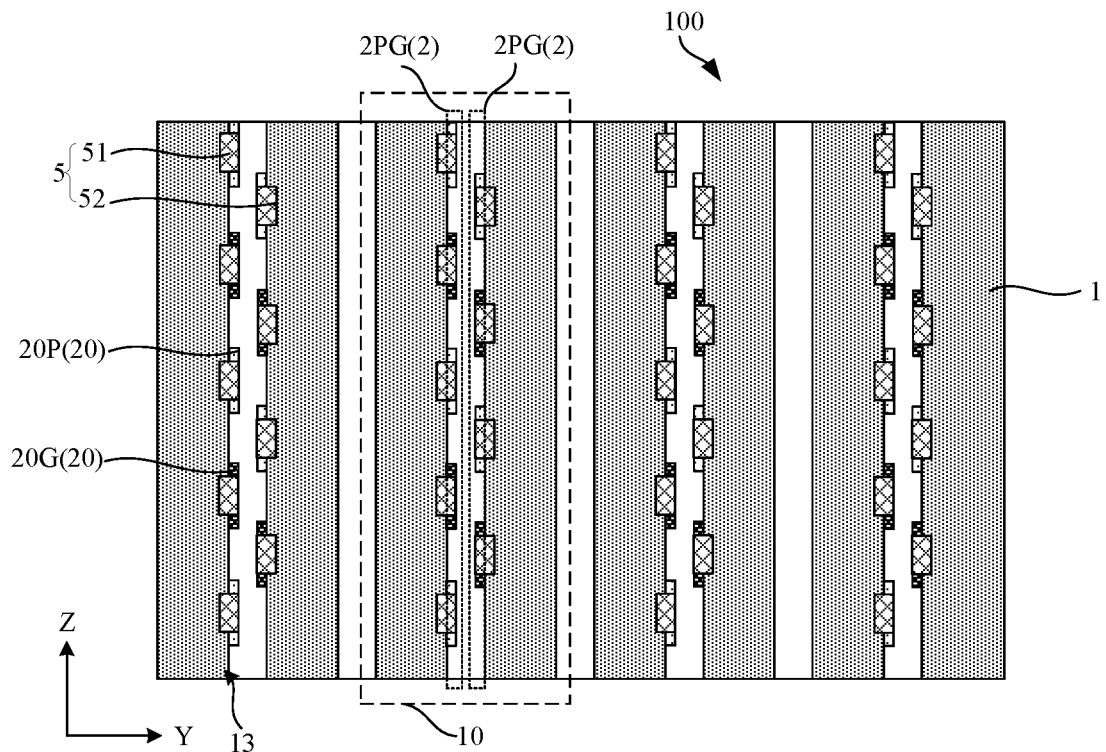

FIG. 11 is a cross-sectional view, and FIG. 12 is a vertical view of the semiconductor structure. For more intuition, FIG. 12 only shows a partial structure of the semiconductor structure. Referring to FIG. 11 and FIG. 12, in Step IV, a pad 5 is formed on the side surface planarized, where the pad 5 is connected to the power supply wiring layer 2. In some embodiments, each of the power source wirings 20P is connected to the pad 5, and each of the ground wirings 20G is connected to the pad 5.

In some embodiments, the planarization is configured to remove all the scribe line regions B, such that the pad 5 is formed on the side surface of the element region A. In some other embodiments, if the planarization is configured to remove part of the scribe line regions B, the pad 5 is formed on the side surface of the scribe line region B.

It should be noted that, if each of the chips 1 has only one scribe line region B, the pad 5 may be formed only on one side of the chip 1. If each of the chips 1 has two scribe line regions B, the pads 5 may be formed on two opposite sides of the chip 1. In this way, a plurality of layers of chip modules 100 stacked in the first direction X may be formed to improve the capacity of the semiconductor structure, and the adjacent chip modules 100 are electrically connected by means of the pads 5.

Referring to FIG. 12, the pad 5 includes a plurality of first pads 51 and a plurality of second pads 52. The first pad 51 and the second pad 52 are respectively connected to the two power supply wiring layers 2 in the chipset 10. In the second direction Y, the first pad 51 is aligned with a gap between two adjacent second pads 52, and the second pad 52 is aligned with a gap between two adjacent first pads 51. In some other embodiments, the first pad 51 may be arranged exactly opposite to the second pad 52 in the second direction Y. That is, in the second direction Y, the first pad 51 is not exactly opposite to the second pad 52. Thus, it is advantageous to increasing the distance between the first pad 51 and the second pad 52, thereby avoiding an erroneous electrical connection between the first pad 51 and the second pad 52.

For ease of understanding, sides of the two chips 1 in the chipset 10 face each other are referred to as inner sides, and sides of the two chips 1 face away from each other are referred to as outer sides. A surface of the inner side of the pad 5 may be flush with a surface of the inner side of the power supply wiring layer 2, and a surface of the outer side of the pad 5 may be protruded relative to a surface of the outer side of the power supply wiring layer 2. In this way, it is advantageous to increasing the distance between the adjacent pads 5 in the second direction Y while ensuring that the pad 5 has a larger dimension, thereby avoiding an erroneous electrical connection between the adjacent pads 5.

Referring to FIG. 13 to FIG. 17, FIG. 13 to FIG. 17 are all partial cross-sectional views. The forming steps of the pad 5 are described in detail below.

Figure 13:
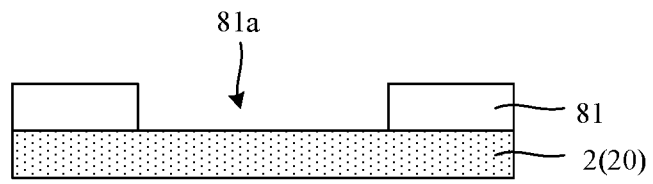

Referring to FIG. 13, a passivation layer 81 is formed on the side surface planarized. The passivation layer 81 has a first opening 81a, and the first opening 81a exposes part of the surface of the power supply wiring layer 2. For example, a passivation material such as silicon oxide and silicon nitride is deposited as the passivation layer 81 on the side surface of the chip module 100 by means of a chemical vapor deposition process, and the passivation layer 81 is patterned to form the first opening 81a to expose part of the surface of the power supply wiring layer 2.

Figure 14:
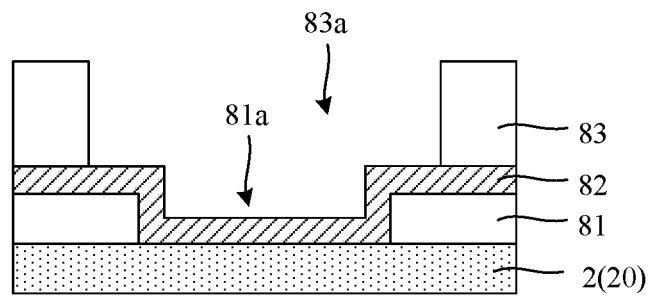

Referring to FIG. 14, a seed layer 82 is formed. The seed layer 82 covers part of the exposed surface of the power supply wiring layer 2 and the passivation layer 81. For example, titanium or copper is deposited as the seed layer 82. The seed layer 82 facilitates the reduction of the contact resistance between the pad 5 formed subsequently and the power supply wiring layer 2.

Still referring to FIG. 14, a mask layer 83 is formed on the side of the passivation layer 81 distant from the element region A, and the mask layer 83 is also positioned on the seed layer 82. The mask layer 83 is patterned to form a second opening 83a. The second opening 83a is directly opposite to the first opening 81a, and exposes part of the surface of the seed layer 82. In some other embodiments, the seed layer 82 may not be formed, and at this time, the second opening 83a exposes part of the surface of the power supply wiring layer 2.

For example, the material of the mask layer 83 may be photoresist, and the photoresist is photoetched to form the second opening 83a.

In some embodiments, the width of the second opening 83a may be greater than the width of the first opening 81a, thereby facilitating the increase of the contact area between the seed layer 82 and the pad 5 formed subsequently, and reducing the contact resistance. In addition, it is advantageous to increasing the volume of the pad 5, to reduce the resistance of the pad 5 itself, and to improve the welding strength between the pad 5 and a peripheral device such as a substrate 9 (referring to FIG. 18).

Figure 15:
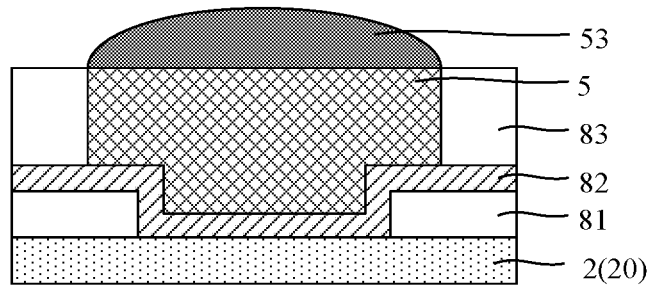

Referring to FIG. 15, the pad 5 is formed in the second opening 83a. The pad 5 also covers the seed layer 82 positioned in the second opening 83a. For example, a metal such as copper or nickel is plated as a pad in the second opening 83a by means of an electroplating process. Thereafter, a solder paste layer 53 may also be formed on the pad 5, and a material of the solder paste layer 53 may be tin and silver.

Figure 16:
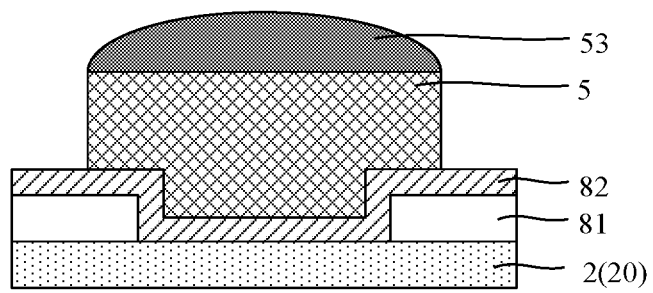
Figure 17:
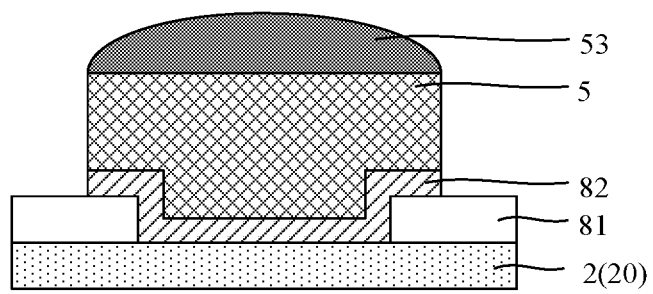
Figure 18:
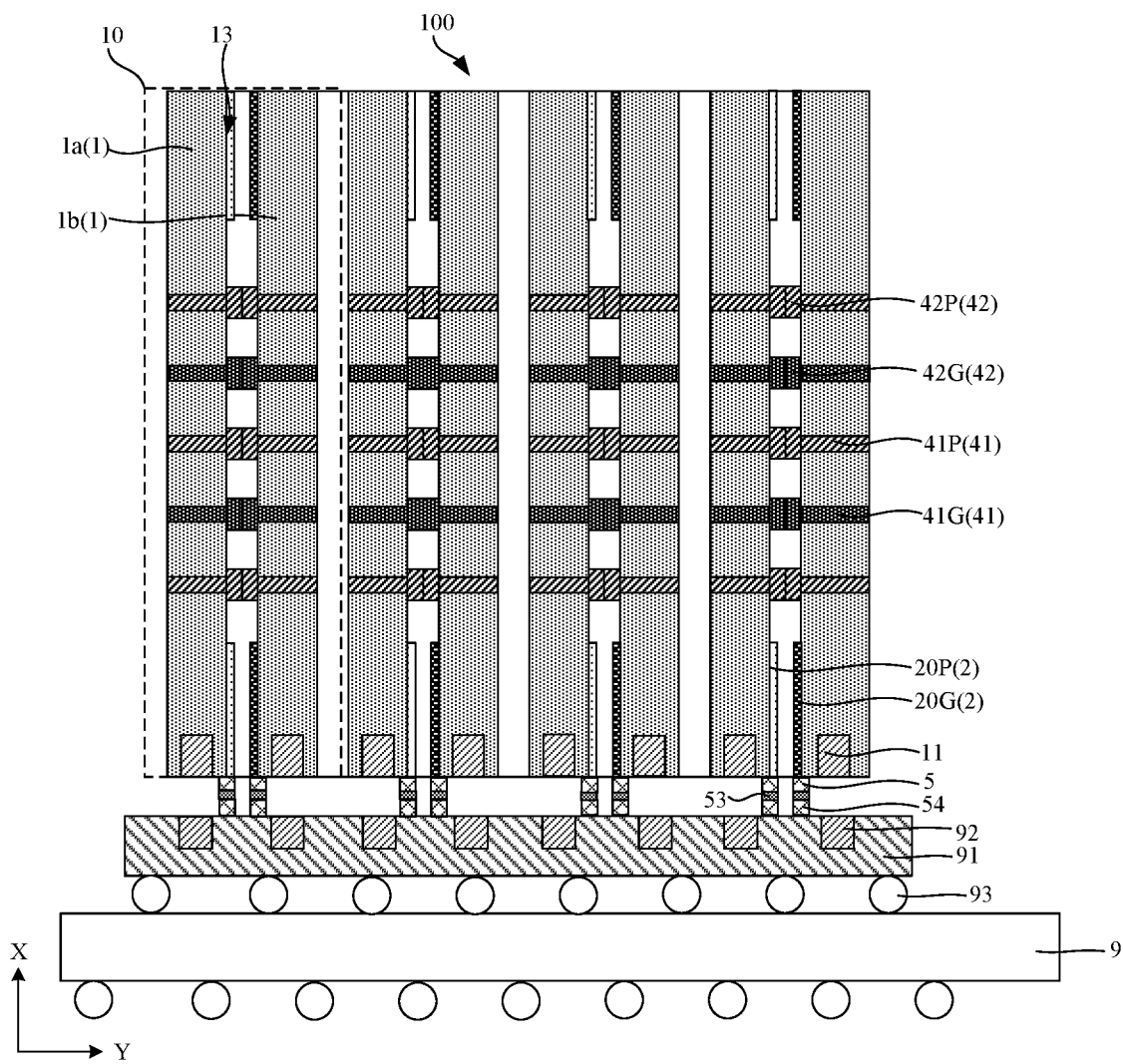
FIG. 18 and FIG. 19 illustrate schematic diagrams of different semiconductor devices according to another embodiment of the present disclosure.

Referring to FIG. 16, the mask layer 83 is removed to expose part of the surface of the seed layer 82. Referring to FIG. 18, the seed layer 82 which is not covered by the pad 5 is removed to prevent a plurality of pads 5 from being electrically connected by means of the seed layer 82.

In some embodiments, referring to FIG. 11 and FIG. 12, the width of the pad 5 in the second direction Y is greater than the width of the power supply wiring layer 2. That is, in the second direction Y, the width of the second opening 83a (referring to FIG. 14) is larger than the width of the power supply wiring layer 2. Thus, it is advantageous to reducing the resistance of the pad 5, and increasing the contact area between the pad 5 and the power supply wiring layer 2, thereby reducing the contact resistance.

In conclusion, the planarization may improve the flatness of the side surface of the chip module 100, thereby avoiding affecting the fabrication process of the pad 5, and avoiding affecting the power supply of the chip module 100. In addition, the power supply wiring layer 2 extends into the scribe line region B, so the power supply wiring layer 2 is easily exposed by means of planarization, to ensure that the power supply wiring layer 2 can be electrically connected to the pad 5, thereby improving the reliability of power supply.

Referring to FIG. 11 and FIG. 12, another embodiment of the present disclosure further provides a semiconductor structure. The semiconductor structure may be fabricated by means of the method for fabricating the semiconductor structure provided in the foregoing embodiment. Reference is made to the foregoing embodiment for a detailed description of the semiconductor structure.

The semiconductor structure includes: a chip module 100 including a plurality of chips 1 stacked, each of the chips 1 including an element region A arranged along a first direction X, a stacking direction of the chips 1 being a second direction Y, and the second direction Y being perpendicular to the first direction X; where at least one of the chips 1 further has a power supply wiring layer 2, and the power supply wiring layer 2 extends to an edge of the chip 1 along the element region A; and where a pad 5 is further provided on the side surface of each of the chips 1, and the pad 5 is connected to the power supply wiring layer 2.

It should be noted that, if the scribe line regions B of the chips 1 are completely removed by means of planarization, the final semiconductor structure does not include the scribe line regions B, and the power supply wiring layer 2 positioned in the element region A is connected to the pad 5. If only part of the scribe line regions B are removed by means of the planarization, the final semiconductor structure further includes part of the scribe line regions B, and the power supply wiring layer 2 positioned in the scribe line regions B is connected to the pad 5.

Another embodiment of the present disclosure further provides a semiconductor device. The semiconductor device may include the semiconductor structure provided in the foregoing embodiment. Reference is made to the foregoing embodiment for a detailed description of the semiconductor structure.

Figure 19:
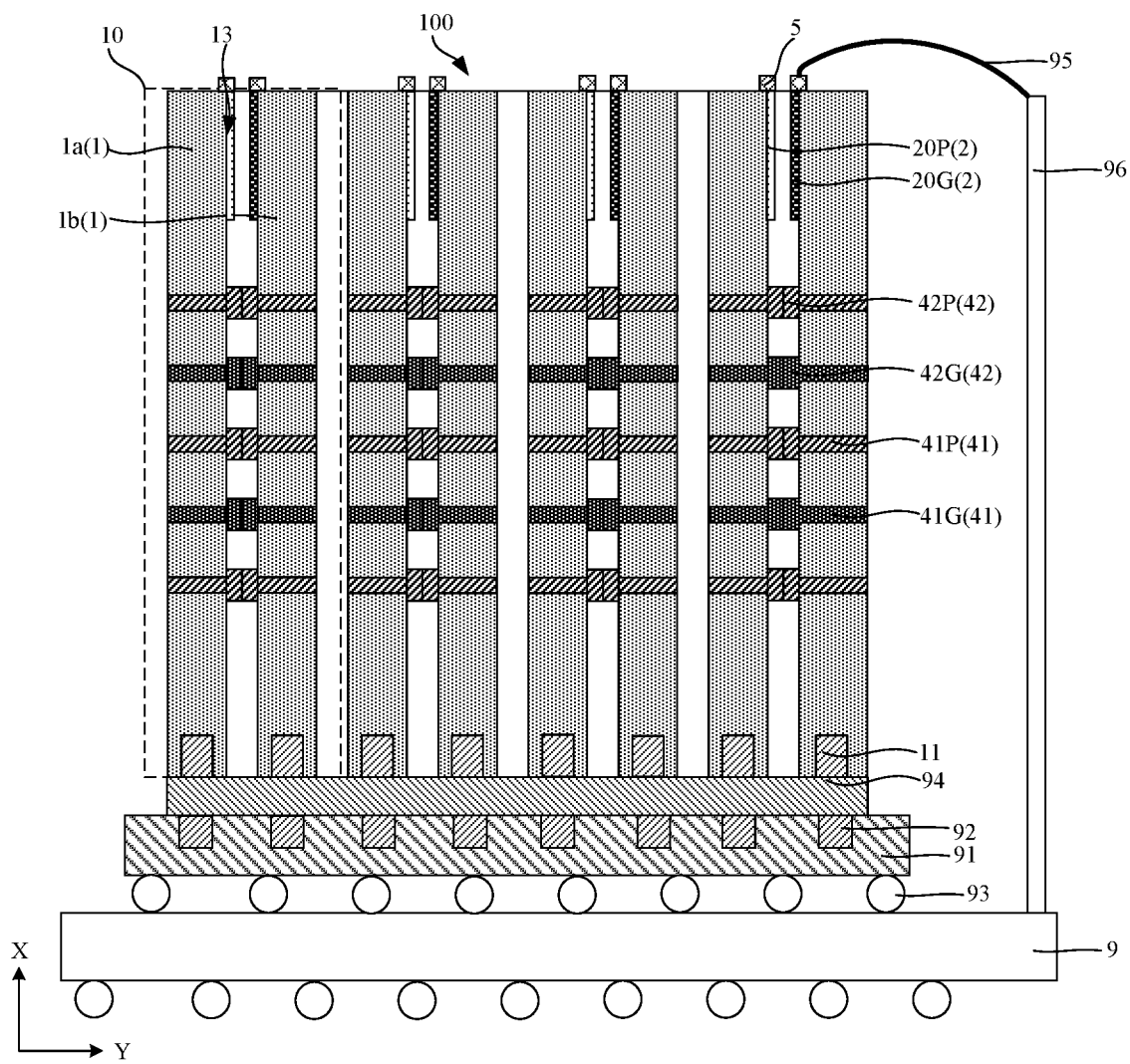

Referring to FIG. 18 and FIG. 19, the semiconductor device includes: a substrate 9; and a chip module 100 provided on the substrate 9, and including a plurality of chips 1 stacked, each of the chips 1 including an element region A arranged along a first direction X, a stacking direction of the chip module 100 being a second direction Y, and the second direction Y being perpendicular to the first direction X; where at least one of the chips 1 further has a power supply wiring layer 2, and the power supply wiring layer 2 extends to an edge of the chip 1 along the element region A; and where a pad 5 is further provided on the side surface of each of the chips 1, and the pad 5 is connected to the power supply wiring layer 2.

For example, the substrate 9 may provide functions such as electrical connection, protection, support, heat dissipation, and assembly for the chip module 100. A power source may be provided on the substrate 9, and the pad 5 may be electrically connected to the power supply (not shown in the figures) on the substrate 9, thereby supplying power to the chip module 100.

In some embodiments, the chip 1 is a memory chip, and the semiconductor device further includes a logic chip 91 positioned between the chip module 100 and the substrate 9. The logic chip 91 has a first wireless communication portion 92, and the memory chip has a second wireless communication portion 11, where the first wireless communication portion 92 performs wireless communication with the second wireless communication portion 11.

It should be noted that, a side surface of a memory chip faces a logic chip 91, such that the area of the side surface is small. When the communication between the memory chip and the logic chip 91 is implemented by means of wireless communication, there is no need to provide a wired communication portion between the memory chip and the logic chip 91. Therefore, a space position between the memory chip and the logic chip 91 may only be configured to arrange a power supply path for the memory chip, thereby reducing the process difficulty.

For example, the second wireless communication portion 11 is positioned on a side of the memory chip facing the logic chip 91. Thus, a distance between the first wireless communication portion 92 and the second wireless communication portion 11 may be reduced, thereby improving quality of wireless communication.

In some embodiments, referring to FIG. 18, the logic chip 91 has a power supply port, where a side of the chip module 100 having the pad 5 faces the logic chip 91, and the pad 5 is electrically connected to the power supply port of the logic chip 91. For example, an upper surface of the logic chip 92 has a solder pad 54 serving as the power supply port of the logic chip 91, and the solder pad 54 is connected to the pad 5 of the chip module 100 through the solder paste layer 53. The power supply port of the logic chip 91 is electrically connected to a power source on the substrate 9, thereby supplying power to the chip module 100.

That is, the pad 5 not only may electrically connect the power supply wiring layer 2 to the power supply port of the logic chip 91, but also can fix the memory chip to the logic chip 91. Therefore, there is no need to provide other fixed structures between the memory chip and the logic chip 91, which is advantageous to reducing the volume of the semiconductor structure.

In some other embodiments, referring to FIG. 19, the substrate 9 has a power supply port. For example, the power supply port of the substrate 9 is positioned on the power source, the side of the chip module 100 having the pad 5 faces away from the logic chip 91, and the pad 5 is electrically connected to the power supply port of the substrate 9. For example, the pad 5 is connected to the power supply port by means of a conductive structure such as a lead 95 and a lead frame 96. In addition, the logic chip 91 and the chip module 100 may be bonded together by the means of an adhesive layer 94, and the logic chip 91 is welded on the substrate 9 by means of a solder ball 93. The bonding process is simple, and the production cost is low.

That is, the pad 5 is only configured to lead out the power supply wiring layer 2, and is not configured to fix the memory chip on the logic chip 91. Because the pad 5 and a wireless communication path are positioned on upper and lower sides of the chip module 100, electromagnetic interference caused by a current in the pad 5 to the wireless communication may be avoided to avoid signal loss.

In some embodiments, referring to FIG. 1, FIG. 2, and FIG. 7, each of the chips 1 has a power supply wiring layer 2. More power supply wiring layers 2 are advantageous to improving the stability of power supply, thereby improving the performance of the semiconductor structure. For example, the power supply signal line 12 and the power supply wiring layer 2 in the same chip 1 are connected to each other. The power supply wiring layers 2 in the different chips 1 are independent of each other, and the power supply signal lines 2 in the different chips 1 are independent of each other.

Figure 9:
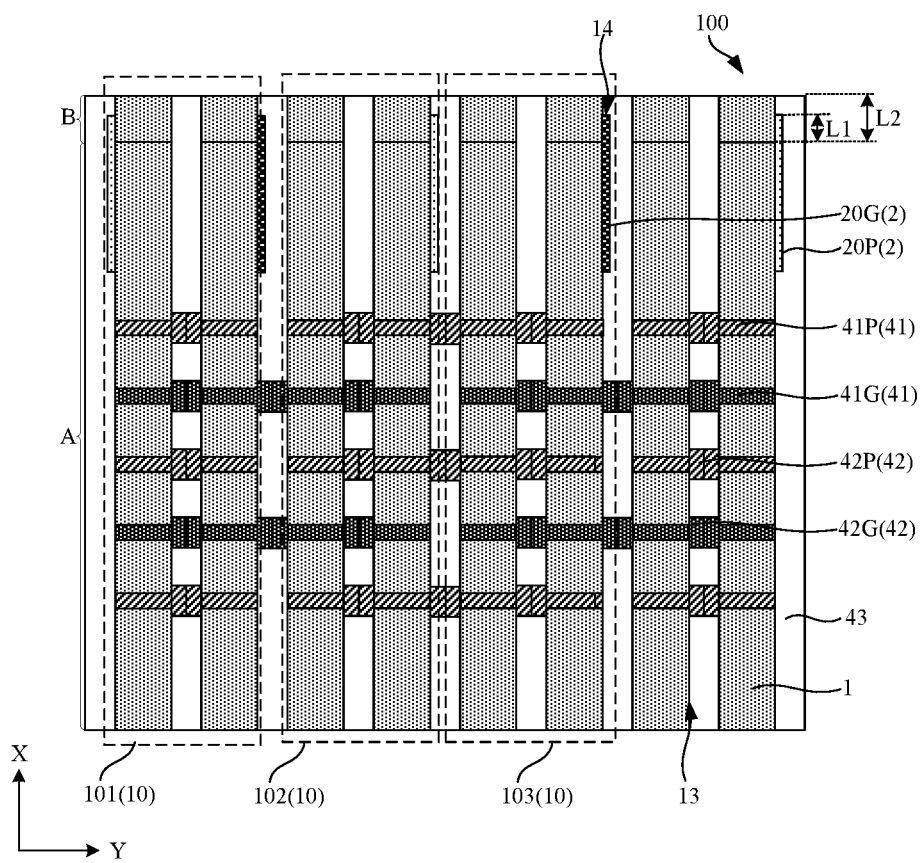

In some embodiments, referring to FIG. 9, at least two adjacent chips 1 are bonded and constitute a chipset 10. One power supply wiring layer 2 is provided between two adjacent chipsets 10, and the power supply wiring layer 2 is electrically connected to the memory chips 1 of the chipsets 10 on two sides thereof. two sides of the chip module 100 each have one power supply wiring layer 2 electrically connected to the chipsets 10 on the two sides.

For a detailed description of the positional relationship and the number relationship between the chip 1 and the power supply wiring layer 2, reference may be made to the foregoing embodiment, which is not repeated herein again.

In the description of this specification, reference to the description of the terms "some embodiments", "for example", etc. means that a particular feature, structure, material or characteristic described in connection with this embodiment or example is included in at least one embodiment or example of the present disclosure. The schematic representation of the above terms throughout this specification is not necessarily referring to the same embodiment or example. Furthermore, the features, structures, materials, or characteristics described may be combined in any suitable manner in one or more embodiments or examples. In addition, without contradiction, those skilled in the art may combine different embodiments or examples described in the specification and features of different embodiments or examples.

Although the embodiments of the present disclosure have been shown and described above, it is to be understood that the above-mentioned embodiments are exemplary and should not be construed as limiting the present disclosure. Those of ordinary skill in the art may make changes, modifications, replacements and variations to the above embodiments without departing from the scope of the present disclosure. Therefore, all changes or embellishments made according to the claims and the specification of the present disclosure shall still fall within the scope covered by the patent of the present disclosure.

What is claimed is:

1. A semiconductor structure comprising:
a chip module comprising a plurality of chips stacked, wherein each of the plurality of chips comprises an element region arranged along a first direction, a stacking direction of the plurality of chips being a second direction, and the second direction being perpendicular to the first direction;
wherein at least one of the plurality of chips further has a power supply wiring layer, and the power supply wiring layer extends to an edge of the at least one chip along the element region; and
wherein a pad is further arranged on a side surface of the at least one chip, and the pad is connected to the power supply wiring layer;
wherein the at least one chip is a memory chip;
the semiconductor device further comprises a logic chip positioned under the chip module; wherein
the logic chip has a first wireless communication portion, the memory chip has a second wireless communication portion, and the first wireless communication portion performs wireless communication with the second wireless communication portion; and
the second wireless communication portion is positioned on a side of the memory chip facing the logic chip;
wherein the logic chip has a power supply port, a side of the chip module having the pad faces the logic chip, and the pad is electrically connected to the power supply port of the logic chip.

2. A semiconductor device comprising:
a substrate; and
a chip module arranged on the substrate and comprising a plurality of chips stacked, wherein each of the plurality of chips comprises an element region arranged along a first direction, a stacking direction of the plurality of chips being a second direction, and the second direction being perpendicular to the first direction;
wherein at least one of the plurality of chips further has a power supply wiring layer, and the power supply wiring layer extends to an edge of the at least one chip along the element region; and
wherein a pad is further arranged on a side surface of the at least one chip, and the pad is connected to the power supply wiring layer;
wherein the at least one chip is a memory chip;
the semiconductor device further comprises a logic chip positioned between the chip module and the substrate; wherein
the logic chip has a first wireless communication portion, the memory chip has a second wireless communication portion, and the first wireless communication portion performs wireless communication with the second wireless communication portion; and
the second wireless communication portion is positioned on a side of the memory chip facing the logic chip;
wherein the logic chip has a power supply port, a side of the chip module having the pad faces the logic chip, and the pad is electrically connected to the power supply port of the logic chip.

3. The semiconductor device according to claim 2, wherein the substrate has a power supply port, a side of the chip module having the pad faces away from the logic chip, and the pad is electrically connected to the power supply port of the substrate.

4. The semiconductor device according to claim 2, wherein at least adjacent two of the plurality of chips are bonded together to constitute a chipset;
one of the power supply wiring layers is provided between adjacent two of the chipsets, and the power supply wiring layer is electrically connected to the chips of the chipsets on two sides of the power supply wiring layer; and
one of the power supply wiring layers is provided between two sides of the chip module, and the power supply wiring layer is electrically connected to the chipsets on the two sides of the chip module, respectively.

5. The semiconductor device according to claim 2, wherein each of the plurality of chips has one of the power supply wiring layers.

6. The semiconductor device according to claim 5, wherein power supply signal lines in same chip are connected to the power supply wiring layers; and
the power supply wiring layers of different chips are independent of each other, and the power supply signal lines of the different chips are independent of each other.

7. The semiconductor structure according to claim 1, wherein at least adjacent two of the plurality of chips are bonded together to constitute a chipset;
- one of the power supply wiring layers is provided between adjacent two of the chipsets, and the power supply wiring layer is electrically connected to the chips of the chipsets on two sides of the power supply wiring layer; and
- one of the power supply wiring layers is provided between two sides of the chip module, and the power supply wiring layer is electrically connected to the chipsets on the two sides of the chip module, respectively.

8. The semiconductor structure according to claim 1, wherein each of the plurality of chips has one of the power supply wiring layers.

9. The semiconductor structure according to claim 8, wherein power supply signal lines in same chip are connected to the power supply wiring layers; and
- the power supply wiring layers of different chips are independent of each other, and the power supply signal lines of the different chips are independent of each other.

10. The semiconductor structure according to claim 1, wherein
- each of the plurality of chips has the power supply wiring layer;
- the power supply wiring layer is a power source wiring layer, a ground wiring layer or a hybrid wiring layer; the power supply wiring layer comprises a plurality of power source wirings, the ground wiring layer comprises a plurality of ground wirings, and the hybrid wiring layer comprises a plurality of power source wirings and a plurality of ground wirings;
- each of the plurality of power source wirings is connected to the pad, and each of the plurality of ground wirings is connected to the pad; and
- the plurality of ground wirings and the plurality of power source wirings of the same hybrid wiring layer are alternately arranged in a third direction, the third direction being perpendicular to the first direction and the second direction.

11. The semiconductor structure according to claim 10, wherein
- each of the plurality of chips is further internally provided with a conductive through-via;
- adjacent two of the plurality of chips are configured to form a chipset;
- a bonding portion is provided between the two chips in the same chipset, the bonding portion being connected to the conductive through-vias of the two chips, such that the two chips are electrically connected to each other; and
- two power supply wiring layers are provided between the two chips in the same chipset, the two power supply wiring layers being respectively positioned on surfaces of the two chips, one of the two power supply wiring layers being the power source wiring layer, and other one of the two power supply wiring layers being the ground wiring layer; or, the two power supply wiring layers being the hybrid power supply wiring layers; or, both the first power supply wiring layer and the second power supply wiring layer being the hybrid wiring layers.

12. The semiconductor structure according to claim 11, wherein the pad comprises a plurality of first pads and a plurality of second pads, each of the plurality of first pads and each of the plurality of second pads being respectively connected to the two power supply wiring layers in the chipset; and
- in the second direction, each of the plurality of first pads is aligned with a gap between adjacent two of the plurality of second pads, and each of the plurality of second pads is aligned with a gap between adjacent two of the plurality of first pads.

13. The semiconductor structure according to claim 10, wherein each of the plurality of chips on two outermost sides of the chip module has the power supply wiring layer; and
- one of the power supply wiring layers is provided between adjacent two of the plurality of chips, and the power supply wiring layer is electrically connected to power supply signal lines of the chips on two sides of the power supply wiring layer.

\* \* \* \* \*